United States Patent

Atsuki et al.

[11] Patent Number: 5,833,745
[45] Date of Patent: Nov. 10, 1998

[54] BI-BASED FERROELECTRIC COMPOSITION AND THIN FILM, METHOD FOR FORMING THE THIN FILM, AND NON-VOLATILE MEMORY

[75] Inventors: Tsutomu Atsuki; Tadashi Yonezawa; Katsumi Ogi, all of Omiya, Japan

[73] Assignee: Mitsubishi Materials Corporation, Tokyo, Japan

[21] Appl. No.: 749,398

[22] Filed: Nov. 15, 1996

[30] Foreign Application Priority Data

Nov. 15, 1995 [JP] Japan .................................. 7-296566
Nov. 29, 1995 [JP] Japan .................................. 7-310815
Mar. 24, 1996 [JP] Japan .................................. 8-046023

[51] Int. Cl.$^6$ .......................... C04B 35/50; C23C 18/00; B05D 3/02
[52] U.S. Cl. ...................... 106/287.18; 427/226; 501/134
[58] Field of Search ...................... 106/287.18; 501/134; 427/226

[56] References Cited

U.S. PATENT DOCUMENTS

| 5,426,075 | 6/1995 | Perino et al. | 437/235 |
| 5,605,723 | 2/1997 | Ogi et al. | 427/226 |
| 5,630,872 | 5/1997 | Ogi et al. | 106/287.18 |
| 5,645,643 | 7/1997 | Ogi et al. | 106/287.19 |
| 5,645,885 | 7/1997 | Nishimoto | 427/126.3 |

*Primary Examiner*—Helene Klemanski
*Attorney, Agent, or Firm*—Oblon, Spivak, McClelland, Maier & Neustadt, P.C.

[57] ABSTRACT

A composition for forming a film, comprising a solution of metal compounds in an organic solvent, wherein a molar ratio of metals in said solution is $(Sr_{1-n}R_n):Bi:(Ta_yNb_{1-y})$ =X:Q:2, R is at least one element selected from the group consisting of La, Ce, Pr, Nd, Eu, Sm, Tb, Gd and Er, and $0<n\leq 0.1$, $0.4\leq X<1$, $0\leq Y\leq 1$ and $1.5\leq Q\leq 3.5$, can be used to form a ferroelectric film. This ferroelectric film is useful in a ferroelectric capacitor, particularly a ferroelectric capacitor for a non-volatile memory.

21 Claims, 1 Drawing Sheet

BI-BASED FERROELECTRIC COMPOSITION AND THIN FILM, METHOD FOR FORMING THE THIN FILM, AND NON-VOLATILE MEMORY

BACKGROUND OF THE INVENTION

1. Field of the Invention

The present invention relates to a Bi-based ferroelectric composition for forming thin film used for semiconductor memories and optical switches, a method for forming the thin film, the Bi-based ferroelectric thin film, and a non-volatile memory comprising capacitors for charge accumulation made of the Bi-based ferroelectric thin film.

2. Description of the Related Art $SrBi_2Ta_2O_9$ is a ferroelectric composition containing Sr, Bi and Ta. Thin films made of this composition exhibit high fatigue resistance, unlike PZT (lead zirconate titanate), where fatigue means the decrease in polarization after repeated polarization inversion cycles. Attempts have been made to apply these thin films to non-volatile semiconductor memories, taking advantage of the hysteresis loss characteristics.

$SrBi_2Ta_2O_9$ has a bulk polarization value Pr of 5.8 $\mu C/cm^2$. Highly integrated memories of 256 Mb, which will be produced in the future, require a remanent polarization value 2Pr of 15 $\mu C/cm^2$ or more, and thus improvement in remanent polarization is essential for the commercialization of thin films exhibiting a decreased fatigue property.

A method for forming a $SrBi_2Ta_2O_9$ thin film is disclosed in PCT Unexamined Patent No. WO94/10702, where a precursor solution having a composition of Sr:Bi:Ta=1:2.4:2 is prepared and then crystallized by repeated film deposition, drying, and calcination. Bi is added in 20% excess to compensate for diffusion and evaporation losses during the heat treatment for crystallization. The substrate, e.g. Pt/Ti/SiO$_2$/Si substrate, is previously calcined at a temperature higher than the maximum temperature used in the film-forming process. A calcination temperature suitable for achieving the electrical characteristics satisfying the conditions set forth above is approximately 700° C.

Although bulk $SrBi_2Ta_2O_9$ has been disclosed, no reports have been disclosed concerning $(Sr_xBi_{1-x})Bi_2Ta_2O_y$ (with 0<x<1). In the process described in PCT Unexamined Patent No. WO94/10702 the substrate is considerably deteriorated by heat, because the substrate temperature during the heat treatment before film deposition, and the calcination temperature after film deposition, are high, i.e., 700° to 800° C., in order to achieve excellent electrical characteristics. For example, when a Pt/Ti/SiO$_2$ or Pt/Ta/SiO$_2$ substrate is calcined at 800° C., the surface of the substrate loses metal gloss and is coarsened by the precipitation of Ta and Ti, and oxidation.

Semiconductor memories are classified as RAM (random access memory) and SAM (sequential access memory) according to the read/write state, or are classified as RWM (read write memory) enabling read and write and ROM (read only memory) enabling only read according to the operation state of memories. Among these types of memories, memories which retain their content when de-energized are referred to as non-volatile memories, while those losing memory content when de-energized are referred to as volatile memories.

Generally used volatile semiconductor memories are classified into DRAM (dynamic random access memory) and SRAM (static random access memory). Each cell of DRAM consists of a transistor and a capacitor. This memory has a simplified structure and is inexpensive due to an increased scale of integration. DRAM memory consumes a large amount of electric power for refresh operations, in which charge lost by spontaneous discharge is supplied to the capacitor. In contrast, SRAM comprises memory cells of flip-flop circuits, each consisting of two transistors, and therefore it is difficult to increase the scale of integration, although the amount of electric power consumed is low. Therefore, DRAM is used as the internal memory of computers during operation, and SRAM, having a small capacity, is used for internal memory during power-off or for external memory, such as memory cards.

Non-volatile memories may be classified as mask ROM, in which the data is recorded during the manufacturing process and the write function is disabled after production, and EPROM (erasable programmable ROM), in which the write function remains enabled. There are two types of EPROMs: UV-EPROM (ultraviolet-EPROM), which writes electrically and erases using ultraviolet-ray irradiation; and flash EPROM, which writes and erases electrically. In EPROMs, a long write time of a few milliseconds is required, and thus the number of repeated data write cycles is low and is limited to approximately $10^4$. Furthermore, complicated control is required for writing operations. Thus, EPROMs cannot be used as a replacement for SRAMs.

Given these circumstances, a novel memory type has attracted attention. This novel memory type has the same structure as a DRAM, consisting of a MOSFET (metal oxide semiconductor field effect transistor) and a capacitor; a ferroelectric material is used for the capacitor instead of conventional $SiO_2$ or $SiN_x$, and the spontaneous polarization of the ferromagnetic material is used. This ferroelectric memory has some advantages: the memory acts simultaneously as RAM and as non-volatile memory which does not require electric power for memory preservation, by using spontaneous polarization; the memory is suitable for integration due to its simple structure; the memory can be driven by a low voltage; and the write time is several microseconds and relatively short compared with EPROM. Thus, the ferroelectric memory has attracted attention as a substitute for HDD (hard disk drives).

FIG. 1A is a schematic cross-section of a unit cell structure of a ferroelectric non-volatile memory and FIG. 1B is a circuit equivalent of the unit cell structure. The unit memory cell comprises a MOSFET 10 and a ferroelectric capacitor 20. The MOSFET 10 substantially consists of n-type impurity regions 2 and 3 as source/drain regions, formed on a p-type silicon substrate 1, and a gate electrode 4 formed between the n-type impurity regions 2 and 3. An interlayer insulation film covers the entire electrode 4.

The ferroelectric capacitor 20 substantially consists of a lower capacitor electrode 5 formed on the side of the MOSFET 10, a ferroelectric material 6 formed on the lower capacitor electrode 5, and an upper capacitor electrode 7 formed on the ferroelectric material 6. The MOSFET 10 connects to the upper capacitor electrode 7 through a conductor 8. In this manner, the gate electrode 4 connects to a word line and the n-type impurity region 2 not connecting to the upper capacitor electrode 7 connects to a drive line, in order to operate as a memory.

PZT has conventionally been used as a ferroelectric material for ferroelectric non-volatile memories. Although PZT has a significantly large initial polarization value Pr of 20 $\mu C/cm^2$, the polarization value decreases as polarization inversion cycles are repeated by applying a voltage, and cannot be used after the number of inversion cycles increases to $10^7$ to $10^8$. Although the number of allowable inversion cycles is larger than that of EEPROM, $10^4$, it will not reach the number of guaranteed action cycles of DRAM, $10^{15}$.

As noted above, although $SrBi_2Ta_2O_9$ has recently attracted attention as a material with polarization value unchanged after many polarization inversion cycles, this material has a relatively low bulk polarization value Pr of approximately 5.8 $\mu C/cm^2$. Therefore, an improvement in remanent polarization is desired.

SUMMARY OF THE INVENTION

An object of the present invention is to provide a Bi-based ferroelectric thin film which does not require a high temperature production process, has a large remanent polarization value, and excellent fatigue resistance.

Another object of the present invention is to provide a non-volatile memory having a high remanent polarization value and an infinite number of operation cycles.

These objects may be provided by a first aspect of the present invention, a Bi-based ferroelectric composition for forming a thin film comprising a solution of metal compounds in an organic solvent, in which the metal composition in molar ratio is expressed as $(Sr_{1-n}R_n):Bi:(Ta_yNb_{1-y})$ =X:Q:2, wherein R is at least one element selected from the group consisting of La, Ce, Pr, Nd, Eu, Sm, Tb, Gd and Er, $0<n\leq 0.1$, $0.4\leq X<1$, $0\leq Y\leq 1$, $1.5\leq Q\leq 3.5$.

This film may be prepared by a method for forming a Bi-based ferroelectric thin film of a Bi-based ferroelectric comprising: applying a Bi-based ferroelectric composition for forming a thin film followed by drying and calcination, and burning for crystallization.

These objects may also be provided by a second aspect of the present invention, a Bi-based ferroelectric composition for forming a thin film comprising: an undercoat layer having a thickness of 5 to 50 nm and a composition of $Bi_2(Ta_rNb_{1-r})_2O_8$, wherein $0\leq r\leq 1$; and a main layer, formed on the undercoat layer, having a composition of $[(Sr_{1-m}(Pb \text{ and/or } Ba)_m)_xBi_{1-x}]Bi_2(Ta_yNb_{1-y})_2O_z$ wherein $0\leq m\leq 0.3$, $0.4\leq X\leq 1$, $0\leq Y\leq 1$, and Z is the sum of oxygen atoms combining with individual metal elements.

This Bi-based ferroelectric thin film may be prepared by a method in accordance with the present invention comprising: forming an undercoat layer having a thickness of 5 to 50 nm and a composition of $Bi_2(Ta_rNb_{1-r})_2O_8$, wherein $0\leq r\leq 1$, on the substrate; and forming a main layer on the undercoat layer, the main layer having a composition of $[(Sr_{1-m}(Pb \text{ and/or } Ba)_m)_xBi_{1-x}]Bi_2(Ta_yNb_{1-y})_2O_z$, wherein $0\leq m\leq 0.3$, $0.4\leq X\leq 1$, $0\leq Y\leq 1$, and Z is the sum of oxygen atoms combining with individual metal elements.

These objects may also be provided by a third aspect of the present invention, a non-volatile memory comprises MOSFETs and ferroelectric capacitors, the data being memorized by spontaneous polarization of the ferroelectric material, and wherein the ferroelectric material is $(Sr_xBi_{1-x})Bi_2(Ta_yNb_{1-y})_2O_z$ wherein $0.4\leq X<1$, $0\leq Y\leq 1$, and Z is the sum of oxygen atoms combining with individual metal elements.

The composition of the ferroelectric material in accordance with the present invention, the Sr in previous Sr—Bi—Ta-based materials is partly replaced with Bi, and a part or all of the Ta is replaced with Nb to improve the ferroelectric characteristics. By such a composition, a ferroelectric material exhibiting large remanent polarization and high fatigue resistance can be obtained.

In the present invention, a part of the Sr in the ferroelectric material may be replaced with Pb and/or Ba. A part of the Sr may be further replaced with at least one element selected from the group consisting of La, Ce, Pr, Nb, Eu, Sm, Tb, Gd and Er.

BRIEF DESCRIPTION OF THE DRAWINGS

Other features and advantages of the invention will be apparent from the following description taken in connection with the accompanying drawing wherein.

DETAILED DESCRIPTION OF THE INVENTION

Figure 1A:
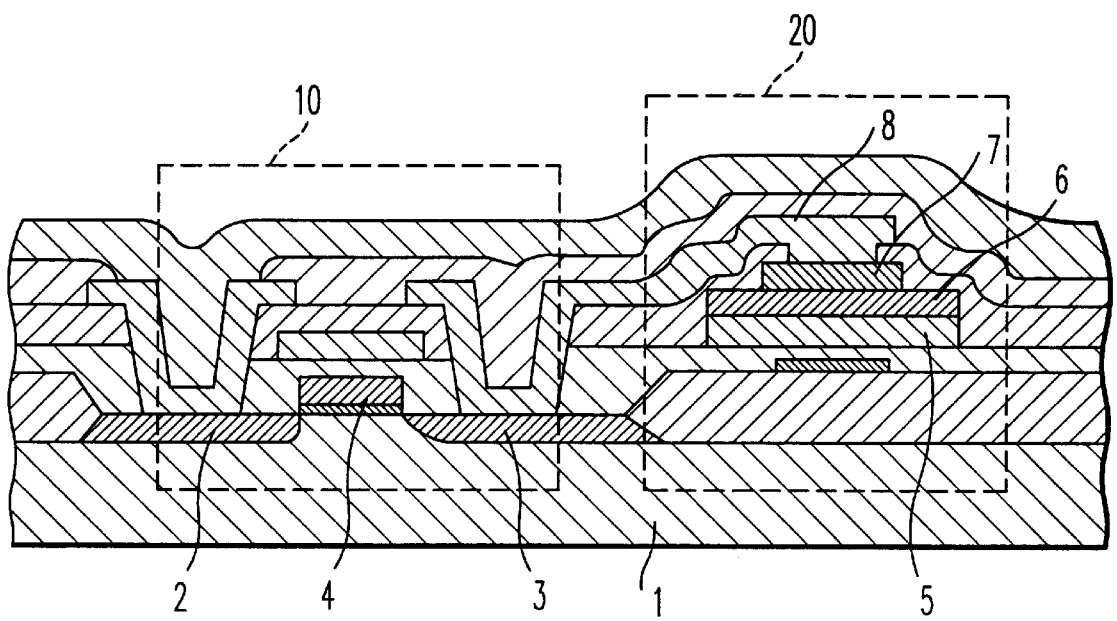
FIG. 1A is a schematic cross-section of a unit cell structure of a ferroelectric non-volatile memory.

First, a Bi-based ferroelectric composition for forming a thin film, a method for forming the thin film, and a Bi-based ferroelectric thin film in accordance with the first aspect of the present invention will be explained.

The Bi-based ferroelectric composition for forming a thin film in accordance with the first aspect of the present invention has a metal composition in molar ratio, which is expressed as $(Sr_{1-n}R_n):Bi:(Ta_yNb_{1-y})=X:Q:2$, when $0.4<X\leq 1$. A ferroelectric thin film exhibiting large remanent polarization and excellent fatigue resistance is obtained. When X is less than 0.4, the remanent polarization is significantly lowered.

Although the stoichiometric ratio in Sr—Bi—Ta-type compounds is primarily Sr:Bi:Ta=1:2:2, the ratio of (Sr+R) is controlled to be less than 1 and not less than 0.4 to obtain a ferroelectric film having a large remanent polarization and excellent fatigue resistance.

When a part of Sr is substituted for a specified rare earth metal R, the remanent polarization increases. However, the ferroelectric characteristic is lost when n is greater than 0.1.

Although satisfactory characteristics cannot be achieved at an extremely low Bi content, excessive Si content causes leaky film formation adverse to electric characteristics. Although the ratio of the Ta and Nb contents can be varied appropriately, a higher Nb content increases remanent polarization and coercive force.

When Q is less than 1.5, satisfactory characteristics cannot be achieved, whereas when Q exceeds 3.5, the thin film is leaky. Thus, the relation, $1.5\leq Q\leq 3.5$, is determined.

Each ratio of $(Ta_yNb_{1-y})$ to X and Q is set to be 2 in consideration of stoichiometry of Sr—Bi—Ta-based composition. By replacing a part of the Sr with at least one element R selected from the group consisting of La, Ce, Pr, Nd, Eu, Sm, Tb, Gd and Er, the remanent polarization is increased. However, when replacement is carried out excessively, the ferroelectric characteristics are lost. Thus, the replacement of R is carried out within $0<n\leq 0.1$ when Sr:R=(1−n):n. When a part or all of the Ta is replaced with Nb, the remanent polarization is increased. The replacement is preferably carried out within $0\leq Y\leq 0.7$ when Ta:Nb=Y:(1−Y).

The Bi-based ferroelectric composition for forming a thin film in accordance with the first aspect can be prepared by mixing organic or inorganic metal compounds with an organic solvent so that the metal composition satisfy the experimental formula set forth above. Since no high temperature process is required by this formula, a ferroelectric thin film having excellent dielectric characteristics can be obtained by avoiding adverse thermal effects to the substrate.

Examples of organic solvents used for the Bi-based ferroelectric composition for forming a thin film include acetate esters, such as ethyl acetate, propyl acetate, butyl acetate, and isoamyl acetate; and alcohols, such as ethanol, propanol, butanol, and 2-methoxyethanol.

Examples of Sr compounds include strontium carboxylates, such as strontium octylate, strontium n-hexanoate, strontium 2-ethylpropionate, and strontium i-valerate; and strontium alkoxides, such as strontium ethoxide, strontium propoxide, and strontium 2-methoxyethoxide. Examples of Bi compounds include organic bismuth compounds such as bismuth carboxylates, such as bismuth octylate, bismuth n-hexanoate, bismuth 2-ethylpropionate, and bismuth i-valerate; and inorganic bismuth compounds such as bismuth nitrate. Examples of Ta compounds include tantalum alkoxides, such as tantalum ethoxide, tantalum propoxide, tantalum butoxide, and tantalum 2-methoxyethoxide; tantalum carboxylates, such as tantalum octylate, tantalum n-hexanoate, tantalum 2-ethylpropionate, and tantalum i-valerate. Examples of Nb compounds include niobium alkoxides, such as niobium ethoxide, niobium propoxide, niobium butoxide, and niobium 2-methoxyethoxide; and niobium carboxylates, such as niobium octylate, niobium n-hexanoate, niobium 2-ethylpropionate, and niobium i-valerate. Examples of individual rare earth metal (R) compounds include carboxylates such as 2-ethylhexanoate; and β-diketonato complexes such as AcAc (acetyl acetonate) complexes and PPM complexes. These metal compounds are mixed with the organic solvent so that the total concentration, measured as reduced oxide, is 5 to 15 percent by weight of the solution.

The method for forming the Bi-based ferroelectric thin film in accordance with the first aspect comprises coating, drying and calcination of the Bi-based ferroelectric composition for forming a thin film on a substrate, repeating until a predetermined thickness is achieved, followed by burning for crystallization. The Bi-based ferroelectric thin film can be formed without heat treatment of the substrate before film deposition, and adverse thermal effects can be avoided because of a low calcination temperature in the film deposition step.

Examples of usable substrates include $Pt/Ti/SiO_2/Si$, $Pt/Ta/SiO_2/Si$, $Pt/SiO_2/Si$, $Ir/IrO_2/Si$, $Pt/TiN/SiO_2/Si$, $Pt/Ir/SiO_2/Si$, $(Pt—Ir\ alloy)/IrO_2/Si$, and $Pt/Ir/IrO_2/Si$. These substrates can be used for film deposition without heat treatment.

The ferroelectric composition may be applied on the substrate by spin coating, dip coating, or fogging. Coating, drying and calcination steps may be repeated until a coated film thickness reaches a predetermined value. Calcination is carried out preferably at a temperature of 200° to 600° C., more preferably, 200° to 400° C., for 1 to 30 minutes.

After a predetermined thickness is achieved, the ferroelectric composition is burned for crystallization. The burning process is performed in an oxidizing atmosphere, preferably at a temperature of 600° to 900° C., more preferably at 600° to 800° C., for 20 minutes to 2 hours. A Bi-based ferroelectric thin film having excellent dielectric characteristics, i.e., high remanent polarization and high fatigue resistance, can be readily formed without a high temperature process.

Preferred thickness of the Bi-based ferroelectric thin film produced in this manner ranges from 10 nm to 1 μm, and more preferably 80 to 800 nm. When the thickness is less than 10 nm, the insulation properties are insufficient, whereas a thickness over 1 μm gives a coarse surface, due to accelerated grain growth.

Next, a Bi-based ferroelectric thin film and a method for making the same in accordance with the second aspect of the present invention will be explained.

In a Bi-based ferroelectric thin film in accordance with a second aspect, when the thickness of the undercoat layer of $Bi_2(Ta_rNb_{1-r})_2O_8$ is less than 5 nm, the undercoat layer does not improve the ferroelectric characteristics of the film sufficiently. When the thickness of the $Bi_2(Ta_rNb_{1-r})_2O_8$ undercoat layer exceeds 50 nm, the remanent polarization of Bi-based ferroelectric thin film is lowered by the effect of the undercoat layer itself. Thus, the thickness of the undercoat layer is preferably 5 to 50 nm.

When the undercoat layer of $Bi_2(Ta_rNb_{1-r})_2O_8$ wherein $0 \leq r \leq$ is formed before forming the main layer of the Bi-based ferroelectric thin film, the undercoat layer acts as a buffer layer, the heat treatment of the substrate before film deposition is not required, and satisfactorily high remanent polarization can be achieved by burning at approximately 700° C., differing from previous methods using temperatures of approximately 800° C. for calcination and crystallization.

The Bi-based ferroelectric thin film in accordance with the second aspect is obtained by forming a main layer having a metals composition of $(Sr_xBi_{1-x})Bi_2(Ta_yNb_{1-y})_2$ on the undercoat layer of $Bi_2(Ta_rNb_{1-r})_2O_8$. In the composition of the main layer, when $0.4 \leq X \leq 1$, a ferroelectric thin film having improved ferroelectric characteristics, high remanent polarization, and high fatigue resistance may be obtained. When X is less than 0.4, the remanent polarization significantly decreases. Although an extremely low Bi content does not contribute to the improvement in characteristics set forth above, an excessive Bi content causes a leaky thin film formation, resulting in unsatisfactory electric characteristics.

The remanent polarization can be raised by replacing part or all of the Ta with Nb. The ratio of replacement, Y, is preferably $0 \leq Y \leq 0.7$. In addition, the main layer of $(Sr_xBi_{1-x})Bi_2(Ta_yNb_{1-y})_2$ may be $[(Sr_{1-m}(Pb\ and/or\ Ba)_m)_xBi_{1-x}]Bi_2(Ta_yNb_{1-y})_2O_z$ which is obtained by replacing a part of the Sr with Pb and/or Ba. By replacing a part of the Sr with Ba, coercive field or operational voltage can be reduced. However, when the ratio of the sum of Ba and Pb to Sr exceeds 0.3, remanent polarization also decreases. When Sr is replaced with Pb, remanent polarization and coercive field increase and the fatigue resistance decreases. Thus, the ratio of the sum of Ba and Pb to Sr is preferably 0.3 or less, i.e., $m \leq 0.3$.

This Ba-based ferroelectric thin film can be readily prepared by forming an undercoat layer of $Bi_2(Ta_rNb_{1-r})_2O_8$ and then a main layer of $(Sr_xBi_{1-x})Bi_2(Ta_yNb_{1-y})_2O_z$ or $[(Sr_{1-m}(Pb\ and/or\ Ba)_m)_xBi_{1-x}]Bi_2(Ta_yNb_{1-y})_2O_z$ on a substrate. The thickness of the main layer of $(Sr_xBi_{1-x})Bi_2(Ta_yNb_{1-y})_2O_z$ or $[(Sr_{1-m}(Pb\ and/or\ Ba)_m)_xBi_{1-x}]Bi_2(Ta_yNb_{1-y})_2O_z$ preferably ranges from 10 nm to 1 μm and more preferably from 80 to 800 nm. A thickness less than 10 nm has insufficient insulation characteristics and a thickness over 1 μm gives a coarse surface because of accelerated grain growth.

A top layer having a composition similar to the undercoat layer of $Bi_2(Ta_rNb_{1-r})_2O_8$ may additionally be formed on the main layer. The top layer preferably has a thickness of approximately 5 to 50 nm. The top layer compensates for defects on the surface layer, improving electrical characteristics. However, when the thickness of the top layer exceeds 50 nm, satisfactory electrical characteristics cannot be achieved.

In order to form a Bi-based ferroelectric thin film in accordance with the second aspect of the present invention, an undercoat layer composition is prepared by mixing organic and/or inorganic metal compounds with an organic solvent so as to achieve a specified metal composition of the undercoat layer; a main layer composition is prepared by mixing organic and/or inorganic metallic compounds with an organic solvent so as to achieve a specified metal composition of the main layer; the undercoat layer composition is applied, dried and calcined on a substrate, and these steps are repeated until the undercoat layer reaches a predetermined thickness; and the main layer composition is applied, dried and calcined on the undercoat layer, and these steps are repeated until the main layer reaches a predetermined thickness. When a $Bi_2(Ta_rNb_{1-r})_2O_8$ layer is additionally formed on the main layer, this film is similarly deposited. The substrate may be burned after film deposition for crystallization.

Organic solvents, Sr compounds, Bi compounds, Ta compounds, and Nb compounds usable for the thin film composition are the same as those in the first aspect of the present invention. These metal compounds are mixed with an organic solvent so that the total concentration of the metal compounds in terms of their oxide compounds ranges from 5 to 15 percent by weight.

Examples of Ba compounds include carboxylate salts, such as barium octylate, barium n-hexanoate, barium 2-ethylpropionate, and barium i-valerate; and alkoxides, such as barium ethoxide, barium propoxide, and barium-2-methoxyethoxide; Examples of Pb compounds include carboxylate salts, such as lead octylate, lead n-hexanoate, lead i-valerate, and lead acetate; and alkoxides, such as lead ethoxide, lead propoxide, and lead butoxide.

The same substrates illustrated in the first aspect of the invention can also be used for the film deposition in the second aspect of the invention, without heat treatment. In the second aspect, the compositions for thin film deposition can be applied on the substrate by spin coating, dip coating, or fogging. Coating, drying and calcination steps may be repeated until the undercoat layer, main layer, and optional top layer each reach their respective predetermined thicknesses. The calcination is performed at a relatively low temperature, preferably 200° to 600° C., more preferably 200° to 400° C. for 1 to 30 minutes.

After the coating, drying and calcination steps, the substrate may be burned in an oxidizing atmosphere, preferably at a temperature of 700° to 900° C., more preferably 750° to 800° C., for 20 minutes to 2 hours, to crystallize individual layers. In this manner, a Bi-based ferroelectric thin film exhibiting a large remanent polarization and high fatigue resistance can be readily formed without a high temperature process.

Next, the non-volatile memory in accordance with a third aspect of the present invention will be explained.

Figure 1B:
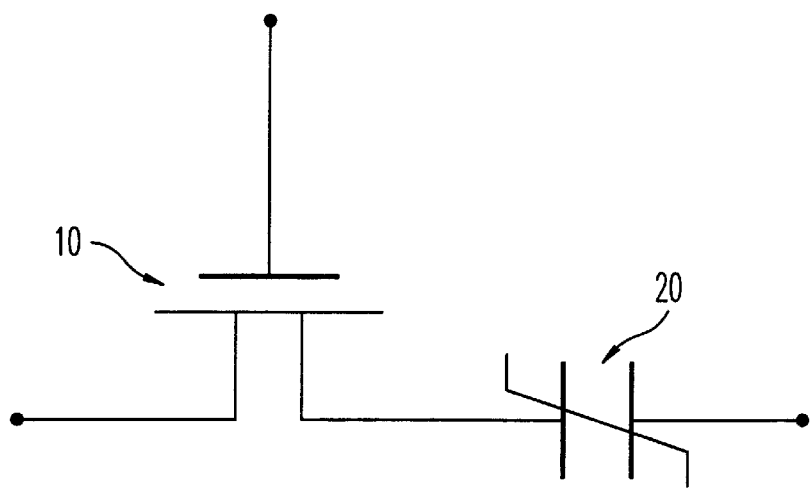
FIG. 1B is a circuit equivalent to the unit cell structure.

The non-volatile memory in accordance with a third aspect of the invention has a configuration similar to a typical non-volatile memory illustrated in FIGS. 1A and 1B, but the ferroelectric thin film comprised of a ferroelectric capacitor has a composition among the following compositions (1) through (3):

(1) $(Sr_xBi_{1-x})Bi_2(Ta_yNb_{1-y})_2O_z$, wherein $0.4 \leq X \leq 1$, $0 \leq Y \leq 1$, and Z is the sum of oxygen atoms bonding with individual metal elements;

(2) $[(Sr_{1-m}(Pb \text{ and/or } Ba)_m)_xBi_{1-x}]Bi_2(Ta_yNb_{1-y})_2O_z$, wherein $0 < m \leq 0.3$, $0.4 \leq X < 1$, $0 \leq Y \leq 1$, and Z is the sum of oxygen atoms combining with individual metal elements;

(3) $((Sr_{1-n}R_n)_xBi_{1-x})Bi_2(Ta_rNb_{1-r})_2O_z$, wherein R is at least one element selected from the group consisting of La, Ce, Pr, Nd, Eu, Sm, Tb, Gd and Er, $0 < n \leq 0.1$, $0.4 \leq X < 1.0$, $0 \leq Y \leq 1$, and Z is the sum of oxygen atoms combining with individual metal elements.

In each of the compositions (1) through (3) set forth above, a ferroelectric thin film exhibiting large remanent polarization and high fatigue resistance can be obtained because of $0.4 \leq X < 1.0$. When X is less than 0.4, the remanent polarization significantly decreases. A part or all of the Ta can be replaced with Nb to increase remanent polarization. The preferred ratio Y of replaced Nb to Ta is $0 \leq Y \leq 0.1$.

In the composition (2) set forth above, the coercive field is decreased by replacing a part of the Sr with Ba. However, excessive replacement causes the remanent polarization to decrease. Alternately, the remanent polarization may be increased by replacing a part of the Sr with Pb. However, excessive replacement causes an increase in the coercive field. Thus, the ratio of the replaced Ba and/or Pb is set to be $0 < m \leq 0.3$.

In the composition (3) set forth above, the remanent polarization is increased by replacing a part of the Sr with at least one element selected from the group consisting of La, Ce, Pr, Nb, Eu, Sm, Tb, Gd and Er. However, excessive replacement causes a loss of the ferroelectric characteristics of the film. Thus, the ratio of the replaced element(s) is set to be $0 < n \leq 0.1$.

The ferroelectric thin film for the non-volatile memory in accordance with the present invention can be readily formed by a sol-gel method using a solution having a predetermined composition so as to obtain a thin film having the specified composition set forth above, or by a sputtering method using a target having a specified composition so as to obtain a thin film having the specified composition set forth above.

EXAMPLES

The present invention will now be more specifically illustrated with reference to Examples and Comparative Examples.

In the composition for thin film in the following Examples and Comparative Examples, isoamyl acetate is used as the organic solvent, tantalum ethoxide as the Ta compound, niobium ethoxide as the Nb compound, bismuth octylate as the Bi compound, strontium octylate as the Sr compound, lead octylate as the Pb compound, and acetates as individual rare earth element compounds. Each compound was mixed with the organic solvent in a given ratio so that the total concentration of individual compounds in terms of the corresponding oxides was 10 percent by weight.

Examples 1 through 12, Comparative Examples 1 through 13

Compositions for forming thin films were prepared by mixing a Ta compound, Nb compound, Bi compound, Sr compound and R compound in ratios shown in Tables 1 and 2. Coating, drying and calcination of each composition were repeated three times on a $Pt/Ta/SiO_2/Si$ substrate. The calcination was carried out at 400° C. for 10 minutes.

The substrate after coating was burned in an oxygen atmosphere at 800° C. for 60 minutes for crystallization to obtain dielectric thin films each having a thickness as shown in Tables 1 and 2. Gold as an upper electrode was deposited on the resulting thin films by vacuum evaporation, followed by annealing at 800° C. for 10 minutes to obtain test samples.

Results of remanent polarization, coercive field, and fatigue property (the ratio % of the remanent polarization after $10^{10}$ inversions to the initial remanent polarization) are summarized in Tables 1 and 2. Tables 1 and 2 demonstrate that the Bi-based ferroelectric thin films in accordance with the present invention exhibit a large remanent polarization and high fatigue resistance.

In contrast, satisfactory results cannot be obtained from Comparative Examples 1 through 7 in which n is greater than 0.1, Comparative Examples 8 through 10 in which X is less than 0.4, and Comparative Examples 11 through 13 in which Q is less than 1.5 or over 3.5.

exhibiting a large remanent polarization and high fatigue resistance can be obtained without multiple high temperature processes and thus without thermal effects on the substrate.

Examples 13 through 28, Comparative Examples 14 through 60

A series of Bi-based ferroelectric thin films were prepared from compositions for forming thin films each having a ratio as shown in Tables 3 through 6, in which each thin film comprises an underlayer, main layer, and optional top layer each having a composition and thickness shown in Tables 7 to 10.

Coating, drying and calcination steps of the composition for forming an undercoat layer were repeated several times

TABLE 1

| Example | Used R Element and Composition in Solution (Sr:R):Bi:(Ta:Nb) = ((1 − n):n)X:Q:2 (Y:(1 − Y)) = (1 − n)X:nx:Q:2Y:2(1 − Y) | | | | | | | Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|
| | 1 − n (Sr) | R | n (R) | X | Q | Y (Ta) | 1 − Y (Nb) | | | | |
| 1 | 0.95 | La | 0.05 | 0.8 | 2.1 | 1 | 0 | 2020 | 14 | 69 | 98 |
| 2 | 0.94 | Ce | 0.06 | 0.8 | 2.3 | 0.5 | 0.5 | 2100 | 13 | 65 | 96 |
| 3 | 0.96 | Pr | 0.04 | 0.8 | 1.9 | 0 | 1 | 2130 | 13 | 66 | 97 |
| 4 | 0.94 | Nd | 0.06 | 0.6 | 2.6 | 1 | 0 | 1980 | 12 | 60 | 94 |
| 5 | 0.98 | Eu | 0.02 | 0.7 | 2.8 | 0.5 | 0.5 | 2130 | 17 | 70 | 93 |
| 6 | 0.94 | Sm | 0.06 | 0.9 | 1.6 | 0 | 1 | 2240 | 14 | 64 | 92 |
| 7 | 0.91 | Tb | 0.09 | 0.6 | 2.3 | 1 | 0 | 2410 | 13 | 59 | 96 |
| 8 | 0.96 | Gd | 0.04 | 0.8 | 2.8 | 0.5 | 0.5 | 2240 | 11 | 55 | 95 |
| 9 | 0.95 | Er | 0.05 | 0.8 | 3.0 | 0 | 1 | 2110 | 16 | 67 | 98 |
| 10 | 0.93 | La Ce | 0.04 0.03 | 0.4 | 2.1 | 1 | 0 | 1990 | 12 | 64 | 98 |
| 11 | 0.92 | La Nd | 0.04 0.04 | 0.8 | 3.2 | 0.5 | 0.5 | 2300 | 13 | 70 | 95 |
| 12 | 0.92 | Ce Er | 0.05 0.03 | 0.9 | 1.9 | 0 | 1 | 2210 | 11 | 62 | 92 |

TABLE 2

| Comparative Example | Used R Element and Composition in Solution (Sr:R):Bi:(Ta:Nb) = ((1 − n):n)X:Q:2(Y: (1 − Y)) = (1 − n)X:nx:Q:2Y:2(1 − Y) | | | | | | | Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|
| | 1 − n (Sr) | R | n (R) | X | Q | Y (Ta) | 1 − Y (Nb) | | | | |
| 1 | 0.85 | Sm | 0.15 | 0.7 | 2.5 | 1 | 0 | 2020 | 8 | 58 | 94 |
| 2 | 0.87 | Eu | 0.13 | 0.9 | 2.2 | 0.5 | 0.5 | 2100 | 7 | 45 | 95 |
| 3 | 0.84 | Pr | 0.16 | 0.8 | 2.6 | 0 | 1 | 2130 | 8 | 55 | 97 |
| 4 | 0.86 | Nd | 0.14 | 0.9 | 1.9 | 1 | 0 | 1980 | 7 | 47 | 98 |
| 5 | 0.80 | La Ce | 0.04 0.16 | 0.5 | 2.5 | 1 | 0 | 1990 | 4 | 38 | 93 |
| 6 | 0.86 | La Nd | 0.09 0.05 | 0.7 | 2.3 | 0.5 | 0.5 | 2300 | 6 | 40 | 95 |
| 7 | 0.83 | Ce Er | 0.10 0.07 | 0.9 | 2.8 | 0 | 1 | 2210 | 5 | 33 | 97 |
| 8 | 0.95 | Eu | 0.05 | 0.11 | 2.6 | 0.5 | 0.5 | 2240 | 3 | 24 | 98 |
| 9 | 0.94 | Tb | 0.06 | 0.2 | 2.9 | 0 | 1 | 2110 | 2 | 13 | 96 |
| 10 | 0.97 | Er Pr | 0.02 0.01 | 0.1 | 2.1 | 1 | 0 | 1990 | 1 | 6 | 98 |
| 11 | 0.92 | Sm | 0.08 | 0.8 | 1.0 | 0.5 | 0.5 | 2240 | 4 | 24 | 93 |
| 12 | 0.93 | Nd | 0.07 | 0.9 | 3.9 | 0 | 1 | 2110 | Not measurable due to leaky thin film | | |
| 13 | 0.98 | Gd Eu | 0.01 0.01 | 0.7 | 1.3 | 1 | 0 | 1990 | 6 | 35 | 92 |

The results set forth above illustrate that, in accordance with the first aspect of the invention, ferroelectric thin films on a Pt/Ta/SiO$_2$/Si substrate by spin coating; and coating, drying and calcination steps of the composition for forming a main layer were repeated several times by spin coating. The deposition of the undercoat layer was eliminated in some Comparative Examples. When a top layer was deposited, coating, drying and calcination steps of the composition for forming the top layer were repeated by spin coating. Calcination was carried out at 400° C. for 10 minutes. The substrate after thin film deposition was burned in an oxygen atmosphere at a temperature as shown in Tables 7 to 10.

Gold as an upper electrode was deposited on the resulting thin films by vacuum evaporation, followed by annealing at the same temperature as the crystallization temperature for 10 minutes to obtain test samples. Results of remanent polarization, coercive field, and fatigue property (the ratio % of the remanent polarization after $10^{10}$ inversions to the initial polarization) are summarized in Tables 7 and 10. Tables 7 and 10 demonstrate that the Bi-based ferroelectric thin films in accordance with the present invention exhibit a large remanent polarization and high fatigue resistance.

TABLE 3

(Sr, Ba)—Bi—(Ta, Nb) Base

| | | Composition in Solution for Undercoat Layer Bi:Ta:Nb = a:b:c | | | Composition in Solution for Main Layer Sr:Ba:Bi:Ta:Nb = d:e:f:g:h | | | | | Composition in Solution for Top Layer Bi:Ta:Nb = i:j:k | | |
|---|---|---|---|---|---|---|---|---|---|---|---|---|
| | | a | b | c | d | e | f | g | h | i | j | k |
| Example | 13 | 2.2 | 0 | 2.0 | 0.56 | 0.24 | 2.2 | 2.0 | 0 | — | — | — |
| | 14 | 2.3 | 1.0 | 1.0 | 0.45 | 0.05 | 3.0 | 1.0 | 1.0 | — | — | — |
| | 15 | 2.1 | 2.0 | 0 | 0.48 | 0.12 | 2.8 | 0 | 2.0 | 2.0 | 1.0 | 1.0 |
| | 16 | 2.0 | 0 | 2.0 | 0.63 | 0.27 | 2.1 | 1.0 | 1.0 | 2.1 | 2.0 | 0 |
| Comparative | 14 | 2.1 | 0 | 2.0 | 0.18 | 0.72 | 2.4 | 1.0 | 1.0 | — | — | — |
| Example | 15 | 2.1 | 0.6 | 1.4 | 0.08 | 0.02 | 3.2 | 0.8 | 1.2 | — | — | — |
| | 16 | — | — | — | 0.56 | 0.24 | 2.1 | 2.0 | 0 | — | — | — |
| | 17 | — | — | — | 0.45 | 0.05 | 3.0 | 1.0 | 1.0 | — | — | — |
| | 18 | — | — | — | 0.48 | 0.12 | 2.8 | 0 | 2.0 | 2.0 | 1.0 | 1.0 |
| | 19 | — | — | — | 0.63 | 0.27 | 2.1 | 1.0 | 1.0 | 2.1 | 2.0 | 0 |
| | 20 | 2.4 | 1.6 | 0.4 | 0.72 | 0.18 | 2.4 | 0 | 0 | — | — | — |
| | 21 | 2.2 | 1.0 | 1.0 | 0.72 | 0.08 | 2.5 | 1.0 | 1.0 | 2.2 | 1.0 | 1.0 |
| | 22 | 2.1 | 0 | 2.0 | 0.72 | 0.18 | 2.2 | 0 | 2.0 | 2.3 | 2.0 | 0 |
| | 23 | — | — | — | 0.64 | 0.16 | 2.4 | 2.0 | 0 | — | — | — |
| | 24 | — | — | — | 0.64 | 0.16 | 2.4 | 2.0 | 0 | — | — | — |
| | 25 | — | — | — | 0.64 | 0.16 | 2.4 | 2.0 | 0 | — | — | — |

TABLE 4

(Sr, Pb)—Bi—(Ta, Nb) Base

| | | Composition in Solution for Undercoat Layer Bi:Ta:Nb = a:b:c | | | Composition in Solution for Main Layer Sr:Pb:Bi:Ta:Nb = d:l:f:g:h | | | | | Composition in Solution for Top Layer Bi:Ta:Nb = i:j:k | | |
|---|---|---|---|---|---|---|---|---|---|---|---|---|
| | | a | b | c | d | l | f | g | h | i | j | k |
| Example | 17 | 2.3 | 2.0 | 0 | 0.8 | 0.2 | 2.2 | 2.0 | 0 | 2.1 | 1.4 | 0.6 |
| | 18 | 2.1 | 1.0 | 1.0 | 0.8 | 0 | 2.4 | 0 | 2.0 | 2.0 | 0.4 | 1.6 |
| | 19 | 2.2 | 0 | 2.0 | 0.45 | 0.05 | 3.0 | 1.2 | 0.8 | — | — | — |
| | 20 | 2.0 | 1.6 | 0.4 | 0.63 | 0.27 | 2.2 | 0.8 | 1.2 | — | — | — |
| Comparative | 26 | 2.2 | 2.0 | 0 | 0.16 | 0.64 | 2.4 | 1.0 | 1.0 | — | — | — |
| Example | 27 | 2.4 | 1.0 | 1.0 | 0.16 | 0.04 | 3.0 | 0.6 | 1.4 | — | — | — |
| | 28 | — | — | — | 0.8 | 0.2 | 2.2 | 2.0 | 0 | — | — | — |
| | 29 | — | — | — | 0.8 | 0 | 2.4 | 0 | 2.0 | — | — | — |
| | 30 | — | — | — | 0.45 | 0.05 | 3.0 | 1.2 | 0.8 | 2.3 | 1.6 | 0.4 |
| | 31 | — | — | — | 0.63 | 0.27 | 2.2 | 0.8 | 1.2 | 2.4 | 0.2 | 1.8 |
| | 32 | 2.1 | 0.8 | 1.2 | 0.64 | 0.16 | 2.4 | 2.0 | 0 | — | — | — |
| | 33 | 2.3 | 0.6 | 1.4 | 0.72 | 0.08 | 2.9 | 1.0 | 1.0 | 2.2 | 1.6 | 0.4 |
| | 34 | 2.2 | 2.0 | 0 | 0.9 | 0 | 2.2 | 0 | 2.0 | 2.4 | 0.2 | 1.8 |
| | 35 | — | — | — | 0.64 | 0.16 | 2.4 | 2.0 | 0 | — | — | — |
| | 36 | — | — | — | 0.64 | 0.16 | 2.4 | 2.0 | 0 | — | — | — |
| | 37 | — | — | — | 0.64 | 0.16 | 2.4 | 2.0 | 0 | — | — | — |

TABLE 5

(Sr, Ba, Pb)—Bi—(Ta, Nb) Base

| | | Composition in Solution for Undercoat Layer Bi:Ta:Nb = a:b:c | | | Composition in Solution for Main Layer Sr:Ba:Pb:Bi:Ta:Nb = d:e:l:f:g:h | | | | | | Composition in Solution for Top Layer Bi:Ta:Nb = i:j:k | | |
|---|---|---|---|---|---|---|---|---|---|---|---|---|---|
| | | a | b | c | d | e | l | f | g | h | i | j | k |
| Example | 21 | 2.3 | 2.0 | 0 | 0.72 | 0.04 | 0.04 | 2.4 | 2.0 | 0 | — | — | — |
| | 22 | 2.4 | 0 | 2.0 | 0.63 | 0.18 | 0.09 | 2.2 | 1.0 | 1.0 | — | — | — |
| | 23 | 2.1 | 1.0 | 1.0 | 0.48 | 0.06 | 0.06 | 2.8 | 1.0 | 1.0 | 2.2 | 1.6 | 0.4 |
| | 24 | 2.2 | 1.2 | 0.8 | 0.49 | 0.07 | 0.14 | 2.5 | 0.4 | 1.6 | 2.1 | 0.8 | 1.2 |
| Comparative | 38 | 2.3 | 1.0 | 1.0 | 0.32 | 0.24 | 0.24 | 2.4 | 2.0 | 0 | — | — | — |
| Example | 39 | 2.1 | 1.0 | 1.0 | 0.14 | 0.04 | 0.02 | 3.0 | 0 | 2.0 | — | — | — |
| | 40 | — | — | — | 0.72 | 0.04 | 0.04 | 2.4 | 2.0 | 0 | — | — | — |
| | 41 | — | — | — | 0.63 | 0.18 | 0.09 | 2.2 | 1.0 | 1.0 | — | — | — |
| | 42 | — | — | — | 0.48 | 0.06 | 0.06 | 2.8 | 1.0 | 1.0 | 2.2 | 1.6 | 0.4 |
| | 43 | — | — | — | 0.49 | 0.07 | 0.14 | 2.5 | 0.4 | 1.6 | 2.1 | 0.8 | 1.2 |
| | 44 | 2.4 | 1.0 | 1.0 | 0.64 | 0.08 | 0.08 | 2.4 | 1.0 | 1.0 | — | — | — |
| | 45 | 2.3 | 2.0 | 0 | 0.63 | 0.18 | 0.09 | 2.2 | 2.0 | 0 | 2.2 | 1.0 | 1.0 |
| | 46 | 2.2 | 0 | 2.0 | 0.49 | 0.07 | 0.14 | 2.8 | 0 | 2.0 | 2.4 | 1.2 | 0.8 |
| | 47 | — | — | — | 0.64 | 0.08 | 0.08 | | 2.0 | 2.0 | — | — | — |
| | 48 | — | — | — | 0.64 | 0.08 | 0.08 | 2.4 | 2.0 | 0 | — | — | — |
| | 49 | — | — | — | 0.64 | 0.08 | 0.08 | | 2.0 | 2.0 | — | — | — |

TABLE 6

Sr—Bi—(Ta, Nb) Base

| | | Composition in Solution for Undercoat Layer Bi:Ta:Nb = a:b:c | | | Composition in Solution for Main Layer Sr:Bi:Ta:Nb = d:f:g:h | | | | Composition in Solution for Top Layer Bi:Ta:Nb = i:j:k | | |
|---|---|---|---|---|---|---|---|---|---|---|---|
| | | a | b | c | d | f | g | h | i | j | k |
| Example | 25 | 2.1 | 0 | 2.0 | 0.8 | 2.4 | 1.0 | 0.5 | — | — | — |
| | 26 | 2.1 | 1.0 | 1.0 | 0.7 | 2.8 | 0 | 2.0 | — | — | — |
| | 27 | 2.3 | 2.0 | 0 | 0.9 | 2.4 | 1.0 | 1.0 | 2.2 | 2.0 | 0 |
| | 28 | 2.1 | 0 | 2.0 | 0.6 | 2.6 | 1.0 | 1.0 | 2.3 | 1.0 | 1.0 |
| Comparative | 50 | 2.2 | 2.0 | 0 | 0.2 | 3.0 | 0.8 | 1.2 | — | — | — |
| Example | 51 | — | — | — | 0.8 | 2.4 | 1.0 | 1.0 | — | — | — |
| | 52 | — | — | — | 0.7 | 2.5 | 0 | 2.0 | — | — | — |
| | 53 | — | — | — | 0.9 | 2.3 | 1.0 | 1.0 | 2.0 | 1.0 | 1.0 |
| | 54 | — | — | — | 0.6 | 2.6 | 2.0 | 0 | 2.1 | 2.0 | 0 |
| | 55 | 2.5 | 1.0 | 1.0 | 0.9 | 2.2 | 1.0 | 1.0 | — | — | — |
| | 56 | 2.3 | 1.2 | 0.8 | 0.8 | 2.5 | 0 | 2.0 | 2.2 | 1.0 | 1.0 |
| | 57 | 2.4 | 2.0 | 0 | 0.7 | 2.5 | 2.0 | 0 | 2.3 | 2.0 | 0 |
| | 58 | — | — | — | 0.8 | 2.5 | 1.0 | 1.0 | — | — | — |
| | 59 | — | — | — | 0.8 | 2.5 | 1.0 | 1.0 | — | — | — |
| | 60 | — | — | — | 0.8 | 2.5 | 1.0 | 1.0 | — | — | — |

TABLE 7

(Sr, Ba)—Bi—(Ta, Nb) Base

| | | Undercoat Layer $Bi_2$ $(Ta_rNb_{1-r})_2O_8$ | | Main Layer $(Sr_{1-m}Ba_m)_xBi_{1-x}Bi_2(Ta_yNb_{1-y})_2O_Z$ | | | | | Top Layer $Bi_2(Ta_rNb_{1-r})_2O_8$ | | Burning Conditions | | Remanent Polarization | Coersive Field | Film Fatigue |
|---|---|---|---|---|---|---|---|---|---|---|---|---|---|---|---|
| | | r | Film Thickness (nm) | X | m | Y | Z | Film Thickness (Å) | r | Film Thickness (nm) | Temp. (°C.) | Time (min.) | $\mu c/cm^2$ 2Pr | kV/cm 2E | Property (%) |
| Example | 13 | 0 | 30 | 0.8 | 0.3 | 1.0 | 9.10 | 2170 | — | 0 | 700 | 60 | 16 | 68 | 97 |
| | 14 | 0.5 | 40 | 0.5 | 0.1 | 0.5 | 9.25 | 1970 | — | 0 | 700 | 60 | 13 | 60 | 95 |
| | 15 | 1.0 | 10 | 0.6 | 0.2 | 0 | 9.20 | 2180 | 0.5 | 10 | 700 | 60 | 14 | 63 | 98 |
| | 16 | 0 | 25 | 0.9 | 0.3 | 0.5 | 9.05 | 2255 | 1.0 | 20 | 700 | 60 | 15 | 58 | 97 |
| Comparative | 14 | 0 | 10 | 0.9 | 0.8 | 0.5 | 9.05 | 2090 | — | 0 | 700 | 60 | 3 | 15 | 97 |
| Example | 15 | 0.3 | 30 | 0.1 | 0.2 | 0.4 | 9.45 | 2020 | — | 0 | 700 | 60 | 2 | 10 | 95 |
| | 16 | — | 0 | 0.8 | 0.3 | 1.0 | 9.10 | 2270 | — | 0 | 700 | 60 | 3 | 23 | 98 |
| | 17 | — | 0 | 0.5 | 0.1 | 0.5 | 9.25 | 1970 | — | 0 | 700 | 60 | 4 | 20 | 95 |
| | 18 | — | 0 | 0.6 | 0.2 | 0 | 9.20 | 2280 | 0.5 | 10 | 700 | 60 | 4 | 15 | 98 |
| | 19 | — | 0 | 0.9 | 0.3 | 0.5 | 9.05 | 2255 | 1.0 | 20 | 700 | 60 | 3 | 20 | 96 |
| | 20 | 0.8 | 70 | 0.9 | 0.2 | 1.0 | 9.05 | 2130 | — | 0 | 700 | 60 | 4 | 18 | 98 |
| | 21 | 0.5 | 60 | 0.8 | 0.1 | 0.5 | 9.10 | 2180 | 0.5 | 60 | 700 | 60 | 2 | 97 | |
| | 22 | — | 10 | 0.9 | 0.2 | 0 | 9.05 | 2040 | 1.0 | 70 | 700 | 60 | 4 | 14 | 98 |
| | 23 | — | 0 | 0.8 | 0.2 | 1.0 | 9.10 | 2210 | 0 | 700 | 60 | 6 | 20 | 98 | |
| | 24 | — | 0 | 0.8 | 0.2 | 1.0 | 9.10 | 2190 | — | 0 | 750 | 60 | 11 | 40 | 97 |
| | 25 | — | 0 | 0.8 | 0.2 | 1.0 | 9.10 | 2170 | — | 0 | 850 | 60 | 16 | 58 | 97 |

TABLE 8

(Sr, Pb)—Bi—(Ta, Nb) Base

| | | Undercoat Layer $Bi_2$ $(Ta_rNb_{1-r})_2O_Z$ | | Main Layer $(Sr_{1-m}Pb_m)_xBi_{1-x}Bi_2(Ta_yNb_{1-y})_2O_Z$ | | | | | Top Layer $Bi_2(Ta_rNb_{1-r})_2O_Z$ | | Burning Conditions | | Remanent Polarization | Coersive Field | Film Fatigue |
|---|---|---|---|---|---|---|---|---|---|---|---|---|---|---|---|
| | | r | Film Thickness (nm) | X | m | Y | Z | Film Thickness (Å) | r | Film Thickness (nm) | Temp. (°C.) | Time (min.) | $\mu c/cm^2$ 2Pr | kV/cm 2E | Property (%) |
| Example | 17 | 1.0 | 15 | 1.0 | 0.2 | 1.0 | 9.00 | 2215 | 0.7 | 20 | 700 | 60 | 16 | 62 | 94 |
| | 18 | 0.5 | 20 | 0.8 | 0 | 0 | 9.10 | 2280 | 0.2 | 30 | 700 | 60 | 12 | 58 | 98 |
| | 19 | 0 | 10 | 0.5 | 0.1 | 0.6 | 9.25 | 2090 | — | 0 | 700 | 60 | 11 | 58 | 92 |
| | 20 | 0.8 | 40 | 0.9 | 0.3 | 0.4 | 9.05 | 2160 | — | 0 | 700 | 60 | 18 | 64 | 90 |
| Comparative | 26 | 1.0 | 30 | 0.8 | 0.8 | 0.5 | 9.10 | 2020 | — | 0 | 700 | 60 | 18 | 70 | 50 |
| Example | 27 | 0.5 | 25 | 0.2 | 0.2 | 0.3 | 9.40 | 2115 | — | 0 | 700 | 60 | 7 | 30 | 92 |
| | 28 | — | 0 | 1.0 | 0.2 | 1.0 | 9.00 | 2205 | — | 0 | 700 | 60 | 8 | 25 | 92 |
| | 29 | — | 0 | 0.8 | 0 | 0 | 9.10 | 2250 | — | 0 | 700 | 60 | 7 | 24 | 98 |
| | 30 | — | 0 | 0.5 | 0.1 | 0.6 | 9.25 | 2090 | 0.8 | 20 | 700 | 60 | 2 | 10 | 96 |
| | 31 | — | 0 | 0.9 | 0.3 | 0.4 | 9.05 | 2160 | 0.1 | 30 | 700 | 60 | 3 | 14 | 91 |
| | 32 | 0.4 | 70 | 0.8 | 0.2 | 1.0 | 9.10 | 2160 | — | 0 | 700 | 60 | 4 | 16 | 92 |
| | 33 | 0.3 | 100 | 0.8 | 0.1 | 0.5 | 9.10 | 1980 | 0.8 | 80 | 700 | 60 | 3 | 15 | 93 |
| | 34 | 1.0 | 20 | 0.9 | 0 | 0 | 9.05 | 2160 | 0.1 | 70 | 700 | 60 | 3 | 14 | 96 |
| | 35 | — | 0 | 0.8 | 0.2 | 1.0 | 9.10 | 2210 | — | 0 | 700 | 60 | 4 | 20 | 94 |
| | 36 | — | 0 | 0.8 | 0.2 | 1.0 | 9.10 | 2130 | — | 0 | 750 | 60 | 9 | 42 | 95 |
| | 37 | — | 0 | 0.8 | 0.2 | 1.0 | 9.10 | 2180 | — | 0 | 800 | 60 | 16 | 60 | 93 |

TABLE 9

(Sr, Ba, Pb)—Bi—(Ta, Nb) Base

| | | Undercoat Layer $Bi_2$ $(Ta_rNb_{1-r})_3O_8$ | | Main Layer $(Sr_{1-(m1\cdot m2)}Ba_{m1}Pb_{m2})_x$ $Bi_{1-x}Bi_2(Ta_yNb_{1-y})_2O_Z$ | | | | | | Top Layer $Bi_2$ $(Ta_rNb_{1-r})_2O_8$ | | Burning Conditions | | Remanent Polarization | Coersive Field | Film Fatigue |
|---|---|---|---|---|---|---|---|---|---|---|---|---|---|---|---|---|
| | | r | Film Thickness (nm) | X | m1 | m2 | Y | Z | Film Thickness (Å) | r | Film Thickness (nm) | Temp. (°C.) | Time (min.) | $\mu c/cm^2$ 2Pr | kV/cm 2Ec | Property (%) |
| Example | 21 | 1.0 | 30 | 0.8 | 0.05 | 0.05 | 1.0 | 9.10 | 2180 | — | 0 | 700 | 60 | 18 | 62 | 98 |
| | 22 | 0 | 20 | 0.9 | 0.2 | 0.1 | 0.5 | 9.05 | 2160 | — | 0 | 700 | 60 | 17 | 60 | 97 |
| | 23 | 0.5 | 25 | 0.6 | 0.1 | 0.1 | 0.5 | 9.20 | 2065 | 0.8 | 20 | 700 | 60 | 14 | 54 | 94 |

TABLE 9-continued (Sr, Ba, Pb)—Bi—(Ta, Nb) Base

| | | Undercoat Layer $Bi_2(Ta_rNb_{1-r})_3O_8$ | | Main Layer $(Sr_{1-(m1-m2)}Ba_{m1}Pb_{m2})_x$ $Bi_{1-x}Bi_2(Ta_yNb_{1-y})_2O_z$ | | | | | | Top Layer $Bi_2(Ta_rNb_{1-r})_2O_8$ | | Burning Conditions | | Remanent Polarization | Coersive Field | Film Fatigue |
|---|---|---|---|---|---|---|---|---|---|---|---|---|---|---|---|---|
| | | | Film Thickness | | | | | | Film Thickness | | Film Thickness | Temp. | Time | $\mu c/cm^2$ | kV/cm | Property |
| | | r | (nm) | X | m1 | m2 | Y | Z | (Å) | r | (nm) | (°C.) | (min.) | 2Pr | 2Ec | (%) |
| | 24 | 0.6 | 20 | 0.7 | 0.1 | 0.2 | 0.2 | 9.15 | 1970 | 0.4 | 40 | 700 | 60 | 15 | 58 | 92 |
| Compa- | 38 | 0.5 | 30 | 0.8 | 0.3 | 0.3 | 1.0 | 9.10 | 2080 | — | 0 | 700 | 60 | 12 | 40 | 87 |
| rative | 39 | 0.5 | 20 | 0.2 | 0.2 | 0.1 | 0 | 9.40 | 2190 | — | 0 | 700 | 60 | 3 | 10 | 90 |
| Example | 40 | — | 0 | 0.8 | 0.05 | 0.05 | 1.0 | 9.10 | 2190 | — | 0 | 700 | 60 | 4 | 12 | 97 |
| | 41 | — | 0 | 0.9 | 0.2 | 0.1 | 0.5 | 9.05 | 2160 | — | 0 | 700 | 60 | 6 | 15 | 96 |
| | 42 | — | 0 | 0.6 | 0.1 | 0.1 | 0.5 | 9.20 | 2075 | 0.8 | 20 | 700 | 60 | 7 | 14 | 95 |
| | 43 | — | 0 | 0.7 | 0.1 | 0.2 | 0.2 | 9.15 | 1970 | 0.4 | 40 | 700 | 60 | 5 | 11 | 98 |
| | 44 | 0.5 | 80 | 0.8 | 0.1 | 0.1 | 0.5 | 9.10 | 2090 | — | 0 | 700 | 60 | 7 | 13 | 94 |
| | 45 | 1.0 | 90 | 0.9 | 0.2 | 0.1 | 1.0 | 9.05 | 2120 | 0.5 | 90 | 700 | 60 | 4 | 10 | 98 |
| | 46 | 0 | 30 | 0.7 | 0.1 | 0.2 | 0 | 9.15 | 2020 | 0.6 | 70 | 700 | 60 | 4 | 9 | 97 |
| | 47 | — | 0 | 0.8 | 0.1 | 0.1 | 1.0 | 9.10 | 2100 | — | 0 | 700 | 60 | 6 | 19 | 97 |
| | 48 | — | 0 | 0.8 | 0.1 | 0.1 | 1.0 | 9.10 | 2150 | — | 0 | 750 | 60 | 10 | 30 | 96 |
| | 49 | — | 0 | 0.8 | 0.1 | 0.1 | 1.0 | 9.10 | 2110 | — | 0 | 800 | 60 | 16 | 60 | 94 |

TABLE 10

Sr—Bi—(Ta, Nb) Base

| | | Undercoat Layer $Bi_2(Ta_rNb_{1-r})_2O_z$ | | Main Layer $(Sr_xBi_{1-x}Bi_2(Ta_yNb_{1-y})_2O_z$ | | | Top Layer $Bi_2(Ta_rNb_{1-r})_2O_8$ | | Burning Conditions | | Remanent Polarization | Coersive Field | Film Fatigue |
|---|---|---|---|---|---|---|---|---|---|---|---|---|---|
| | | | Film Thickness | | | | | Film Thickness | Temp. | Time | $\mu c/cm^2$ | kV/cm | Property |
| | | r | (nm) | X | Y | Z | (Å) | r | (nm) | (°C.) | (min.) | 2Pr | 2Ec | (%) |
| Example | 25 | 0 | 20 | 0.8 | 0.5 | 9.10 | 2010 | — | 0 | 700 | 60 | 16 | 66 | 98 |
| | 26 | 0.5 | 30 | 0.7 | 0 | 9.15 | 2200 | — | 0 | 700 | 60 | 16 | 69 | 97 |
| | 27 | 1.0 | 10 | 0.9 | 0.5 | 9.05 | 2040 | 1.0 | 10 | 700 | 60 | 12 | 61 | 96 |
| | 28 | 0 | 30 | 0.6 | 0.5 | 9.20 | 2100 | 0.5 | 20 | 700 | 60 | 13 | 56 | 98 |
| Comparative | 50 | 1.0 | 25 | 0.2 | 0.4 | 9.40 | 2230 | — | 0 | 700 | 60 | 2 | 16 | 94 |
| Example | 51 | — | 0 | 0.8 | 0.5 | 9.10 | 2080 | — | 0 | 700 | 60 | 4 | 18 | 95 |
| | 52 | — | 0 | 0.7 | 0 | 9.15 | 2100 | — | 0 | 700 | 60 | 5 | 18 | 95 |
| | 53 | — | 0 | 0.9 | 0.5 | 9.05 | 2050 | 0.5 | 20 | 700 | 60 | 3 | 14 | 97 |
| | 54 | — | 0 | 0.6 | 1.0 | 9.20 | 2060 | 1.0 | 30 | 700 | 60 | 3 | 21 | 99 |
| | 55 | 0.5 | 60 | 0.9 | 0.5 | 9.05 | 2040 | — | 0 | 700 | 60 | 4 | 17 | 96 |
| | 56 | 0.6 | 80 | 0.8 | 0 | 9.10 | 2180 | 0.5 | 100 | 700 | 60 | 4 | 11 | 95 |
| | 57 | 1.0 | 20 | 0.7 | 1.0 | 9.15 | 2230 | 1.0 | 70 | 700 | 60 | 5 | 18 | 97 |
| | 58 | — | 0 | 0.8 | 0.5 | 9.10 | 2150 | — | 0 | 700 | 60 | 5 | 24 | 97 |
| | 59 | — | 0 | 0.8 | 0.5 | 9.10 | 2110 | — | 0 | 750 | 60 | 10 | 44 | 98 |
| | 60 | — | 0 | 0.8 | 0.5 | 9.10 | 2000 | — | 0 | 800 | 60 | 17 | 57 | 94 |

The results set forth above illustrate that, in accordance with the second aspect of the invention, ferroelectric thin films exhibiting a large remanent polarization and high fatigue resistance can be obtained without multiple high temperature processes and thus without thermal effects on the substrate.

Examples 29 through 62, Comparative Examples 61 through 97

A series of Bi-based ferroelectric thin films were prepared from compositions for forming thin films each having a ratio shown in Tables 11 through 16; coating, drying and calcination steps of the composition for forming the thin film were repeated three times on a Pt/Ta/SiO$_2$/Si substrate by spin coating; and the substrate after thin film deposition was burned in an oxygen atmosphere at a temperature as shown in Tables 11 to 16. Calcination was carried out at 400° C. for 10 minutes. Results of remanent polarization, coercive field, and fatigue property (the ratio % of the remanent polarization after $10^{10}$ inversions to the initial remanent polarization) of each ferroelectric thin film are summarized in Tables 11 and 16.

The results set forth above illustrate that, in accordance with the third aspect of the invention, a non-volatile memory of a ferroelectric capacitor, which exhibit a large remanent polarization, is suitable for large scale integration, and does not have restricted read/write cycles or exhibits a high fatigue resistance, can be obtained.

TABLE 11

(Sr, Ba)—Bi—(Ta, Nb) Base

| | | Composition in Solution for Thin Film Sr:Ba:Bi:Ta:Nb = a:b:c:d:e | | | | | Composition $(Sr_{1-m}Ba_m)_XBi_{1-X}Bi_2(Ta_YNb_{1-Y})_2O_Z$ | | | | Dielectric Thin Film Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|---|---|---|
| | | a | b | c | d | e | m | X | Y | Z | | | | |
| Example | 29 | 0.72 | 0.18 | 2.2 | 2.0 | 0 | 0.2 | 0.9 | 1.0 | 9.05 | 2130 | 15 | 78 | 96 |
| | 30 | 0.72 | 0.18 | 2.1 | 1.0 | 1.0 | 0.2 | 0.9 | 0.5 | 9.05 | 2210 | 14 | 68 | 96 |
| | 31 | 0.56 | 0.24 | 2.4 | 0 | 2.0 | 0.3 | 0.8 | 0 | 9.10 | 2320 | 14 | 62 | 98 |
| | 32 | 0.56 | 0.14 | 2.7 | 2.0 | 0 | 0.2 | 0.7 | 1.0 | 9.15 | 2110 | 12 | 60 | 95 |
| | 33 | 0.56 | 0.14 | 3.0 | 1.0 | 1.0 | 0.2 | 0.7 | 0.5 | 9.15 | 2230 | 12 | 70 | 97 |
| | 34 | 0.54 | 0.06 | 2.5 | 0 | 2.0 | 0.1 | 0.6 | 0 | 9.20 | 2010 | 12 | 74 | 94 |
| Comparative Example | 61 | 0.4 | 0.4 | 2.3 | 2.0 | 0 | 0.5 | 0.8 | 1.0 | 9.10 | 2030 | 6 | 50 | 99 |
| | 62 | 0.48 | 0.32 | 2.5 | 1.0 | 1.0 | 0.4 | 0.8 | 0.5 | 9.10 | 2200 | 7 | 48 | 96 |
| | 63 | 0.24 | 0.56 | 3.1 | 0 | 2.0 | 0.7 | 0.8 | 0 | 9.10 | 2100 | 3 | 10 | 98 |
| | 64 | 0.24 | 0.06 | 3.1 | 2.0 | 0 | 0.2 | 0.3 | 1.0 | 9.35 | 2040 | 2 | 3 | 93 |
| | 65 | 0.14 | 0.06 | 3.3 | 1.0 | 1.0 | 0.3 | 0.2 | 0.5 | 9.40 | 2030 | 2 | 4 | 95 |
| | 66 | 0.21 | 0.09 | 3.1 | 0 | 2.0 | 0.3 | 0.3 | 0 | 9.35 | 2120 | 2 | 3 | 95 |
| | 67 | 0.81 | 0.09 | 4.1 | 1.0 | 1.0 | 0.1 | 0.9 | 0.5 | 9.05 | 2070 | Not measurable due to leaky thin film | | |
| | 68 | 0.56 | 0.14 | 4.3 | 1.0 | 1.0 | 0.2 | 0.7 | 0.5 | 9.15 | 2270 | Not measurable due to leaky thin film | | |

TABLE 12

(Sr, Pb)—Bi—(Ta, Nb) Base

| | | Composition in Solution for Thin Film Sr:Pb:Bi:Ta:Nb = a:f:c:d:e | | | | | Composition $(Sr_{1-m}Ba_m)_XBi_{1-X}Bi_2(Ta_YNb_{1-Y})_2O_Z$ | | | | Dielectric Thin Film Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|---|---|---|
| | | a | f | c | d | e | m | X | Y | Z | | | | |
| Example | 35 | 0.64 | 0.16 | 2.4 | 0 | 2.0 | 0.2 | 0.8 | 0 | 9.10 | 2130 | 19 | 68 | 96 |
| | 36 | 0.56 | 0.14 | 2.5 | 1.0 | 1.0 | 0.2 | 0.7 | 0.5 | 9.15 | 2210 | 18 | 79 | 93 |
| | 37 | 0.63 | 0.27 | 2.2 | 2.0 | 0 | 0.3 | 0.9 | 1.0 | 9.05 | 2400 | 21 | 80 | 92 |
| | 38 | 0.45 | 0.05 | 3.4 | 2.0 | 0 | 0.1 | 0.5 | 1.0 | 9.25 | 2130 | 12 | 51 | 94 |
| | 39 | 0.54 | 0.06 | 2.8 | 1.0 | 1.0 | 0.1 | 0.6 | 0.5 | 9.20 | 2270 | 12 | 58 | 95 |
| | 40 | 0.45 | 0.05 | 2.6 | 0 | 2.0 | 0.1 | 0.5 | 0 | 9.25 | 1990 | 11 | 62 | 94 |
| Comparative Example | 69 | 0.45 | 0.45 | 2.2 | 2.0 | 0 | 0.5 | 0.9 | 1.0 | 9.05 | 2100 | 25 | 85 | 75 |
| | 70 | 0.27 | 0.63 | 3.1 | 1.0 | 1.0 | 0.7 | 0.9 | 0.5 | 9.05 | 2040 | 27 | 90 | 55 |
| | 71 | 0.07 | 0.63 | 2.5 | 0 | 2.0 | 0.9 | 0.7 | 0 | 9.15 | 2180 | 28 | 100 | 45 |
| | 72 | 0.24 | 0.06 | 3.2 | 2.0 | 0 | 0.2 | 0.3 | 1.0 | 9.35 | 2290 | 6 | 14 | 97 |
| | 73 | 0.18 | 0.09 | 3.4 | 1.0 | 1.0 | 0.1 | 0.2 | 0.5 | 9.40 | 1980 | 2 | 6 | 93 |
| | 74 | 0.08 | 0.02 | 3.2 | 0 | 2.0 | 0.2 | 0.1 | 0 | 9.45 | 2220 | 2 | 9 | 89 |
| | 75 | 0.64 | 0.16 | 4.3 | 1.0 | 1.0 | 0.2 | 0.8 | 0.5 | 9.10 | 2090 | Not measurable due to leaky thin film | | |
| | 76 | 0.81 | 0.09 | 4.1 | 1.0 | 1.0 | 0.1 | 0.9 | 0.5 | 9.05 | 2210 | Not measurable due to leaky thin film | | |

TABLE 13

(Dr, Ba, Pb)—Bi—(Ta, Nb) Base

| | | Composition in Solution for Thin Film Sr:Ba:Pb:Bi:Nb = a:b:f:c:d:e | | | | | | Composition $(Sr_{1-(m1+m2)}Ba_{m1}Pb_{m2})_X Bi_{1-X}$ $Bi_2(Ta_Y Nb_{1-Y})_2 O_Z$ | | | | | Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|---|---|---|---|---|
| | | a | b | f | c | d | e | m1 | m2 | X | Y | Z | | | | |
| Example | 41 | 0.63 | 0.18 | 0.09 | 2.4 | 2.0 | 0 | 0.2 | 0.1 | 0.9 | 1.0 | 9.05 | 2100 | 18 | 75 | 96 |
| | 42 | 0.56 | 0.08 | 0.16 | 2.5 | 1.0 | 1.0 | 0.1 | 0.2 | 0.8 | 0.5 | 9.10 | 2270 | 19 | 81 | 93 |
| | 43 | 0.48 | 0.06 | 0.06 | 2.8 | 0 | 2.0 | 0.1 | 0.1 | 0.6 | 0 | 9.20 | 2080 | 12 | 64 | 97 |
| | 44 | 0.35 | 0.05 | 0.10 | 3.0 | 1.0 | 1.0 | 0.1 | 0.2 | 0.5 | 0.5 | 9.25 | 2060 | 11 | 68 | 91 |
| Comparative Example | 77 | 0.32 | 0.24 | 0.24 | 2.5 | 2.0 | 0 | 0.3 | 0.3 | 0.8 | 1.0 | 9.10 | 2110 | 14 | 66 | 87 |
| | 78 | 0.14 | 0.04 | 0.02 | 3.0 | 1.0 | 1.0 | 0.2 | 0.1 | 9.2 | 0.5 | 9.40 | 2300 | 3 | 8 | 92 |
| | 79 | 0.63 | 0.09 | 0.18 | 4.2 | 0 | 2.0 | 0.1 | 0.2 | 0.9 | 0 | 9.05 | 2240 | Not measurable due to leaky thin film | | |
| | 80 | 0.64 | 0.08 | 0.08 | 4.5 | 1.0 | 1.0 | 0.1 | 0.1 | 0.8 | 0.5 | 9.05 | 2060 | Not measurable due to leaky thin film | | |

TABLE 14

(Sr, R)-Bi—(Ta, Nb) Base

| | Composition in Solution for Thin Film Sr:R:Bi:Ta:Nb = a:g:c:d:e | | | | | | Dielectric Thin Film Composition $(Sr_{1-n}R_n)_X Bi_{1-X} Bi_2(Ta_Y Nb_{1-Y})_2 O_Z$ | | | | | | Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|---|---|---|---|---|
| Example | a | R | g | c | d | e | R | n | X | Y | Z | | | | | |
| 45 | 0.837 | Ce | 0.027 | 2.2 | 1.0 | 1.0 | Ce | 0.03 | 0.9 | 0.5 | 9.0635 | | 2020 | 17 | 70 | 97 |
| 46 | 0.665 | La | 0.035 | 2.4 | 2.0 | 0 | La | 0.05 | 0.7 | 1.0 | 9.1675 | | 2100 | 15 | 65 | 98 |
| 47 | 0.864 | Pr | 0.036 | 2.2 | 1.0 | 1.0 | Pr | 0.04 | 0.9 | 0.5 | 9.0680 | | 2130 | 18 | 67 | 96 |
| 48 | 0.552 | Sm | 0.048 | 2.8 | 0 | 2.0 | Sm | 0.08 | 0.6 | 0 | 9.2240 | | 1980 | 16 | 64 | 97 |
| 49 | 0.968 | Eu | 0.032 | 2.9 | 2.0 | 0 | Eu | 0.04 | 0.8 | 1.0 | 9.1160 | | 2130 | 16 | 70 | 95 |
| 50 | 0.855 | Nd | 0.045 | 2.4 | 1.0 | 1.0 | Nd | 0.05 | 0.9 | 0.5 | 9.0725 | | 2240 | 18 | 68 | 98 |
| 51 | 0.582 | Tb | 0.018 | 3.0 | 0 | 2.0 | Tb | 0.03 | 0.6 | 0 | 9.209 | | 2410 | 14 | 65 | 94 |
| 52 | 0.828 | Er | 0.072 | 2.4 | 3.0 | 0 | Er | 0.08 | 0.9 | 1.0 | 9.086 | | 2240 | 17 | 65 | 96 |
| 53 | 0.672 | Gd | 0.028 | 3.0 | 1.0 | 1.0 | Gd | 0.04 | 0.7 | 0.5 | 9.164 | | 2110 | 16 | 68 | 94 |
| 54 | 0.480 | Gd | 0.015 | 2.5 | 0 | 2.0 | Gd | 0.03 | 0.5 | 0 | 9.260 | | 1990 | 13 | 60 | 97 |
| | | La | 0.005 | | | | La | 0.01 | | | | | | | | |
| 55 | 0.665 | Sm | 0.014 | 3.0 | 2.0 | 0 | Sm | 0.02 | 0.7 | 1.0 | 9.164 | | 2300 | 17 | 60 | 93 |
| | | Nd | 0.014 | | | | Nd | 0.02 | | | | | | | | |
| 56 | 0.736 | Pr | 0.032 | 2.4 | 1.0 | 1.0 | Pr | 0.04 | 0.8 | 0.5 | 9.132 | | 2210 | 18 | 64 | 94 |
| | | Eu | 0.032 | | | | Eu | 0.04 | | | | | | | | |

TABLE 15

(Sr, R)-Bi—(Ta, Nb) Base

| | Composition in Solution for Thin Film Sr:R:Bi:Ta:Nb = a:g:c:d:e | | | | | | Dielectric Thin Film Composition $(Sr_{1-n}R_n)_X Bi_{1-X} Bi_2(Ta_Y Nb_{1-Y})_2 O_Z$ | | | | | Film Thickness (Å) | Remanent Polarization ($\mu C/cm^2$) 2Pr | Coersive Field (kV/cm) 2Ec | Film Fatigue Property (%) |
|---|---|---|---|---|---|---|---|---|---|---|---|---|---|---|---|
| Comparative Example | a | R | g | c | d | E | R | n | X | Y | Z | | | | |
| 81 | 0.696 | Pr | 0.104 | 2.4 | 0 | 2.0 | Pr | 0.13 | 0.8 | 0 | 9.152 | 2120 | 7 | 51 | 97 |
| 82 | 0.616 | Nd | 0.084 | 2.3 | 1.0 | 1.0 | Nd | 0.12 | 0.7 | 0.5 | 9.192 | 223Q | 8 | 48 | 96 |
| 83 | 0.747 | Sm | 0.126 | 2.7 | 2.0 | 0 | Sm | 0.14 | 0.9 | 1.0 | 9.113 | 1990 | 5 | 50 | 98 |
| 84 | 0.64 | Ce | 0.18 | 2.3 | 0 | 2.0 | Ce | 0.20 | 0.8 | 0 | 9.18 | 1980 | 6 | 49 | 94 |
| 85 | 0.486 | La | 0.036 | 2.4 | 2.0 | 0 | La | 0.06 | 0.6 | 1.0 | 9.257 | 2120 | 5 | 35 | 96 |
| | | Ce | 0.078 | | | | Ce | 0.13 | | | | | | | |
| 86 | 0.656 | Tb | 0.04 | 2.6 | 1.0 | 1.0 | Tb | 0.05 | 0.8 | 0.5 | 9.172 | 2200 | 6 | 43 | 93 |
| | | Eu | 0.104 | | | | Eu | 0.13 | | | | | | | |
| 87 | 0.581 | Ce | 0.063 | 2.7 | 0 | 2.0 | Ce | 0.09 | 0.7 | 0 | 9.2095 | 2270 | 7 | 36 | 95 |

TABLE 15-continued (Sr, R)-Bi—(Ta, Nb) Base

| Comparative Example | Composition in Solution for Thin Film Sr:R:Bi:Ta:Nb = a:g:c:d:e | | | | | | Dielectric Thin Film | | | | | Remanent Polarization ($\mu C/cm^2$) | Coersive Field (kV/cm) | Film Fatigue Property |
|---|---|---|---|---|---|---|---|---|---|---|---|---|---|---|
| | | | | | | | Composition $(Sr_{1-n}R_n)_xBi_{1-x}Bi_2(Ta_yNb_{1-y})_2O_z$ | | | | | Film Thickness | | | |
| | a | R | g | c | d | E | R | n | X | Y | Z | (Å) | 2Pr | 2Ec | (%) |
| | | Er | 0.056 | | | | Er | 0.08 | | | | | | | |
| 88 | 0.186 | Ce | 0.014 | 2.8 | 1.0 | 1.0 | Ce | 0.07 | 0.2 | 0.5 | 9.407 | 2210 | 3 | 16 | 93 |
| 89 | 0.276 | Eu | 0.024 | 2.8 | 0 | 2.0 | Eu | 0.08 | 0.3 | 0 | 9.362 | 2040 | 3 | 13 | 97 |
| | | Nd | 0.001 | | | | Nd | 0.01 | | | | | | | |
| 90 | 0.097 | Er | 0.002 | 2.9 | 2.0 | 0 | Er | 0.02 | 0.1 | 1.0 | 9.4515 | 2070 | 2 | 7 | 92 |
| 91 | 0.864 | La | 0.036 | 4.5 | 1.0 | 1.0 | La | 0.04 | 0.9 | 0.5 | 9.068 | 2080 | Not measurable due to leaky thin film | | |
| 92 | 0.752 | Sm | 0.048 | 4.0 | 0 | 2.0 | Sm | 0.06 | 0.8 | 0 | 9.124 | 2140 | Not measurable due to leaky thin film | | |
| 93 | 0.651 | Gd | 0.028 | 4.3 | 2.0 | 0 | Gd | 0.04 | 0.7 | 1.0 | 9.1745 | 2170 | Not measurable due to leaky thin film | | |
| | | Er | 0.021 | | | | Er | 0.03 | | | | | | | |

TABLE 16

Sr—Bi—(Ta, Nb) Base

| | | Composition in Solution for Thin Film Sr:Bi:Ta:Nb = a:c:d:e | | | | Dielectric Thin Film | | | | Remanent Polarization ($\mu C/cm^2$) | Coersive Field (kV/cm) | Film Fatigue Property |
|---|---|---|---|---|---|---|---|---|---|---|---|---|
| | | | | | | Composition $Sr_xBi_{1-x}Bi_2(Ta_yNb_{1-y})_2O_z$ | | | Film Thickness | | | |
| | | a | c | d | e | X | Y | Z | (Å) | 2Pr | 2Ec | (%) |
| Example | 57 | 0.9 | 2.1 | 2.0 | 0 | 0.9 | 1.0 | 9.05 | 2110 | 14 | 67 | 98 |
| | 58 | 0.8 | 2.4 | 1.6 | 0.4 | 0.8 | 0.8 | 9.10 | 2200 | 17 | 79 | 97 |
| | 59 | 0.8 | 2.8 | 1.0 | 1.0 | 0.8 | 0.5 | 9.10 | 2190 | 17 | 78 | 98 |
| | 60 | 0.6 | 3.0 | 0.8 | 1.2 | 0.6 | 0.4 | 9.20 | 2020 | 14 | 70 | 96 |
| | 61 | 0.4 | 2.8 | 0.2 | 1.8 | 0.4 | 0.1 | 9.30 | 2130 | 11 | 55 | 98 |
| | 62 | 0.9 | 2.2 | 0 | 2.0 | 0.9 | 0 | 9.05 | 2150 | 13 | 60 | 95 |
| Comparative | 94 | 0.2 | 3.0 | 2.0 | 0 | 0.2 | 1.0 | 9.40 | 2230 | 4 | 10 | 98 |
| Example | 95 | 1.0 | 2.0 | 2.0 | 0 | 1.0 | 1.0 | 9.0 | 2150 | 2 | 7 | 97 |
| | 96 | 0.2 | 2.8 | 0 | 2.0 | 0.2 | 0 | 9.40 | 2070 | 3 | 8 | 98 |
| | 97 | 1.2 | 2.0 | 0 | 2.0 | 1.2 | 0 | 9.20 | 2090 | 1 | 4 | 96 |

Obviously, numerous modifications and variations of the present invention are possible in light of the above teachings. It is therefore to be understood that within the scope of the appended claims, the invention may be practiced otherwise than as specifically described herein.

The priority documents of the present application, Japanese Patent applications HEI 7-296566, filed on Nov. 15, 1995, HEI 7-310815, filed on Nov. 29, 1995, and HEI 8-046023, filed on Mar. 24, 1996, are all hereby incorporated by reference.

What is claimed as new and desired to be secured by Letters Patent of the United States is:

1. A composition for forming a film, comprising a solution of metal compounds in an organic solvent, wherein a molar ratio of metals in said solution is $(Sr_{1-n}R_n):Bi:(Ta_yNb_{1-y})=X:Q:2$, R is at least one element selected from the group consisting of La, Ce, Pr, Nd, Eu, Sm, Tb, Gd and Er, $0<n\leq 0.1$, $0.4\leq X\leq 1$, $0\leq Y\leq 1$ and $1.5\leq Q\leq 3.5$.

2. The composition of claim 1, wherein the metal compounds in said solution are present in a total concentration of 5 to 15 percent by weight.

3. A method for forming a ferroelectric film, comprising: applying the composition of claim 1 to a substrate, thereby forming a layer;

drying and calcining said layer; and crystallizing said layer by burning.

4. The method of claim 3, wherein the substrate is not heat treated prior to said applying.

5. The method of claim 3, wherein said calcining is performed at 200° to 400° C. for 1 to 30 minutes, and said burning is performed at 600° C. to 800° C. for 20 minutes to 2 hours.

6. A ferroelectric film prepared by the process of claim 3.

7. The ferroelectric film of claim 6, wherein said ferroelectric film has a thickness of 10 nm to 1 $\mu$m.

8. A ferroelectric film comprising:

(i) an undercoat layer having a thickness of 5 to 50 nm and comprising $Bi_2(Ta_rNb_{1-r})_2O_8$, wherein $0\leq r\leq 1$; and (ii) a main layer, formed on said under coat layer, comprising $((Sr_{1-m}A_m)_xBi_{1-x})Bi_2(Ta_yNb_{1-y})_2$ oxide, wherein $0\leq m\leq 0.3$, $0.4\leq X\leq 1$, $0\leq Y\leq 1$ and A is at least one element selected from the group consisting of Pb and Ba.

9. The ferroelectric film of claim 8, wherein m=0.

10. The ferroelectric film of claim 8 further comprising (iii) a top layer, on said main layer, having a thickness of 5 to 50 nm and comprising $Bi_2(Ta_rNb_{1-r})_2O_8$, wherein $0\leq r\leq 1$.

11. The ferroelectric film of claim 9 further comprising (iii) a top layer, on said main layer, having a thickness of 5 to 50 nm and comprising $Bi_2(Ta_rNb_{1-r})_2O_8$, wherein $0 \leq r \leq 1$.

12. The ferroelectric film of claim 8, wherein said main layer has a thickness of 10 nm to 1 μm.

13. The ferroelectric film of claim 9, wherein said main layer has a thickness of 10 nm to 1 μm.

14. A method for forming the ferroelectric film of claim 8, comprising:

depositing an undercoat layer on a substrate; and depositing a main layer on said undercoat layer.

15. A method for forming the ferroelectric film of claim 9, comprising:

depositing an undercoat layer on a substrate; and depositing a main layer on said undercoat layer.

16. A method for forming the ferroelectric film of claim 10, comprising:

depositing an undercoat layer on a substrate;

depositing a main layer on said undercoat layer; and depositing a top layer on said main layer.

17. A method for forming the ferroelectric film of claim 11, comprising:

depositing an undercoat layer on a substrate;

depositing a main layer on said undercoat layer; and depositing a top layer on said main layer.

18. A method for forming the ferroelectric film of claim 12, comprising:

depositing an undercoat layer on a substrate; and depositing a main layer on said undercoat layer.

19. A method for forming the ferroelectric film of claim 13, comprising:

depositing an undercoat layer on a substrate; and depositing a main layer on said undercoat layer.

20. The method of claim 14, wherein the substrate is not heat treated prior to said depositing said undercoat layer.

21. The method of claim 15, wherein the substrate is not heat treated prior to said depositing said undercoat layer.

* * * * *

UNITED STATES PATENT AND TRADEMARK OFFICE
CERTIFICATE OF CORRECTION

PATENT NO. : 5,833,745
DATED : November 10, 1998
INVENTOR(S) : Tsutomu ATSUKI et al.

It is certified that error appears in the above-identified patent and that said Letters Patent is hereby corrected as shown below:

On the title page, item [30], Foreign Application Priority Data should read:

Nov. 15, 1995 [JP] Japan ...................................7-296566
Nov. 29, 1995 [JP] Japan ...................................7-310815
Mar.  4, 1996 [JP] Japan ...................................8-046023

Signed and Sealed this

Thirteenth Day of July, 1999

Attest:

Q. TODD DICKINSON

*Attesting Officer*    *Acting Commissioner of Patents and Trademarks*

UNITED STATES PATENT AND TRADEMARK OFFICE
CERTIFICATE OF CORRECTION

PATENT NO. : 5,833,745

DATED : November 10, 1998

INVENTOR(S): Tsutomu Atsuki, et al.

It is certified that an error appears in the above-identified patent and that said Letters Patent is hereby corrected as shown below:

Column 4, Line 42, "Si" should read --Bi--.

Table 13, Line 2, "(Dr, Ba, Pb-Bi-(Ta, Nb) Base" should read --(Sr, Ba, Pb-Bi-(Ta, Nb) Base--.

Signed and Sealed this

Twenty-sixth Day of October, 1999

Attest:

Q. TODD DICKINSON

*Attesting Officer*   Acting Commissioner of Patents and Trademarks